United States Patent [19]

Patterson, III

[11] 4,122,414
[45] Oct. 24, 1978

[54] CMOS NEGATIVE RESISTANCE OSCILLATOR

[75] Inventor: Raymond B. Patterson, III, Melbourne, Fla.

[73] Assignee: Harris Corporation, Cleveland, Ohio

[21] Appl. No.: 841,250

[22] Filed: Oct. 11, 1977

[51] Int. Cl.² .......................... H03B 5/36; H03B 7/06
[52] U.S. Cl. ................................ 331/116 R; 331/111; 331/115
[58] Field of Search .......... 331/116 R, 108 C, 108 D, 331/111, 115; 58/23 R, 23 AC, 23 V

[56] References Cited

U.S. PATENT DOCUMENTS

| | | | |
|---|---|---|---|
| 3,855,549 | 12/1974 | Huener et al. | 331/116 R |
| 3,887,881 | 6/1975 | Hoffmann | 331/116 R |
| 3,956,714 | 5/1976 | Luscher | 331/116 R |
| 4,013,979 | 3/1977 | Vittoz | 331/108 D |
| 4,048,590 | 9/1977 | Dobberpuhl | 331/116 R |

*Primary Examiner*—John Kominski
*Attorney, Agent, or Firm*—Leitner, Palan, Martin & Bernstein

[57] ABSTRACT

A CMOS oscillator including a first pair of series connected CMOS devices and second pair of series connected CMOS devices, a resistance connected to the source of one of said MOS devices of the first pair having a width to length ratio greater than the width to length ratio of the corresponding device of the second pair, and a series resonant frequency determining network. The resistance and the larger W/L MOS device determine the steady state operating current independent of other circuit elements. The gates of the one MOS device and corresponding MOS devices are connected to the drain of the corresponding device and the other MOS devices are connected as current mirrors.

14 Claims, 3 Drawing Figures

CMOS NEGATIVE RESISTANCE OSCILLATOR

BACKGROUND OF THE INVENTION

The present invention relates generally to oscillators and more specifically to a CMOS negative resistance oscillator.

The use of integrated circuit technology to reduce power consumption using CMOS devices is well-known in the art. These circuits have generally been CMOS implementations of transistor oscillator circuits. A typical example of the prior art CMOS circuits having low power consumption and high stability is shown in U.S. Pat. No. 4,013,979. This patent shows a "Pierce" circuit wherein the frequency determining network is a crystal in a high impedance $\pi$ network. Oscillation is initiated by leakage current through two parallel CMOS current path wherein the geometry of the CMOS are unbalanced.

The use of a high impedance $\pi$ configuration is undesirable in that it requires a greater number of linear components of significant size than, for example, the low impedance series resonance networks. Also, the circuit of the aforementioned patent has steady state operating conditions established by one MOS device, the linear components and the power supply voltage. Thus the oscillator is sensitive to the aging of the linear components as well as fluctuation or variation in the power supply voltage. These effects are undesirable. Similarly, the high impedance network is not as easy to temperature stabilize as the low impedance series mode of operation.

Thus there exists a need for a CMOS oscillator which reduces the number of linear components, has the frequency determining network operated in the series resonance mode, and whose steady state operating conditions are idependent of the frequency determining network and insensitive to power supply voltage variation.

SUMMARY OF THE INVENTION

The CMOS negative resistance oscillator of the present invention includes a low impedance, series resonance frequency determining network connected across a resistor in series with an MOS device whose width to length ratio is greater than the width to length ratio of a corresponding channel device in a parallel CMOS device current path. The resistance, which is slightly greater than the highest series resonant resistance of the frequency determining network, and the larger width to length ratio MOS device determine the steady state operating current independent of other circuit elements. The larger width to length ratio MOS device is part of a CMOS pair connected in series with the resistance to a voltage supply. A second pair of CMOS devices connected in series between the voltage supply provide a second parallel current path. The large W/L MOS device and corresponding MOS device have their gates connected to the drain of the corresponding MOS device. The complementary MOS devices of the first and second pair are connected as a mirror having their gates connected to the drain of the large W/L MOS device.

A CMOS negative resistance oscillator according to the present invention may provide rectangular wave output signals by including a third and fourth pair of CMOS devices connected as the first and second pair including a second resistance connected to the source of the larger W/L MOS device of the third pair. The frequency determining network is connected between the junction of the first and second resistances and the sources of the respective MOS devices of the first and third pair respectively. A fifth pair of CMOS devices is connected in series to the voltage source and comprises an output circuit. The P channel device of the fifth pair has its gate connected to the drain of the P channel device of the second or fourth pair and the gate of the N channel device of the fifth pair is connected to the drain of the N channel of the first or third pair which is not in the set of the second or fourth pair to which the P channel gate of the fifth pair is connected. The output of the junction of the CMOS devices of the fifth pair provides a rectangular output wave.

Another oscillator of the present invention which is very insensitive to supply voltage variations, includes in addition to the first and second pair of CMOS devices, a sixth pair of CMOS devices connected in series between the series connection of the first CMOS pair and a seventh pair of CMOS devices connected in series between the series connection of the second CMOS pair. The gates of the CMOS devices of the sixth and seventh pair are connected as are the gates of the corresponding devices of the first and second pair. An output circuit includes a resistor connected in a series to the voltage supply with an eighth MOS device having the same channel type as the MOS device having the larger W/L. The gate of the eighth MOS device is connected to the drain of the MOS device of the seventh pair having the same channel type. This circuit produces a sinusoidal output waveform superimposed on a DC level.

OBJECTS OF THE INVENTION

An object of the present invention is to provide a negative resistance, CMOS oscillator.

Another object is to provide CMOS oscillator with a reduced number of linear elements.

A further object of the invention is to provide a CMOS oscillator taking advantage of the low impedance series resonant mode of a frequency determining network.

Still another object is to provide a CMOS oscillator whose steady state operating current is a function of a single resistance and MOS device independent of other circuit elements.

Other objects, advantages, and novel features of the invention will become apparent from the following detailed description of the invention when considered in conjunction with the accompanying drawings.

DESCRIPTION OF THE PREFERRED EMBODIMENTS

Figure 1:
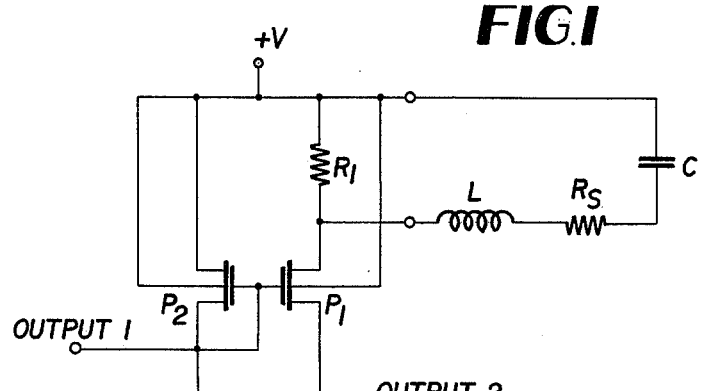
FIG. 1 is a schematic of a CMOS negative resistance oscillator incorporating the principles of the present invention.

A negative resistance CMOS oscillator is illustrated in FIG. 1 as including a first pair of CMOS devices $P_1$ and $N_1$ having their source-drain paths connected in series drain between the voltage supply $+V$ and $-V$ with a resistor $R_1$. A second pair of CMOS devices $P_2$ and $N_2$ have their source-drain paths connected in series between the power supply. A frequency determining network including an inductor L, resistance $R_S$ and a capacitance C are connected in the series with each other and across the resistor $R_1$. According to the principles of the invention, $R_1$ should be slightly greater than the highest series resonant resistance $R_S$ for stability and to induce oscillation. The ratio of width to length (W/L) of $P_1$ is selected to be greater than the ratio W/L for $P_2$.

The resistor $R_1$ is always connected directly to the source of the MOS device of the pair which has a larger W/L than the corresponding channel device of the second pair. Thus the circuit of the present invention may be made wherein the N channel device $N_1$ has a greater W/L than $N_2$ and the resistor $R_1$ (with the frequency determining network) is connected directly between the source of $N_1$ and the voltage supply-V.

Once the resistor $R_1$ is chosen to be greater than the series resonant resistance $R_S$ of the frequency determining network the multiple X, which the W/L ratio of $P_1$ is greater than the W/L ratio of $P_2$ (namely $W_1/L_1 = XW_2/L_2$) is chosen to provide the nominal operating, steady state current for the oscillator. The gates of the P channel devices $P_1$ and $P_2$ are connected to the drain of $P_2$ at the junction of the CMOS devices of the second pair. The gates of the N channel devices $N_1$ and $N_2$ are connected to the drain of $P_1$ at the junction of the CMOS devices of the first pair. The gates of the unbalanced channel MOS devices should be connected to the pair junction of the smaller W/L pair.

An analysis of the oscillator of FIG. 1 begins with the equation for the current through an MOS device operating in the saturated region:

$$I = K'(W/L)(V_{GS} - V_T)^2$$

where
K' = a constant determined by process variables
W = channel width
L = channel length
$V_T$ = threshold voltage
$V_{GS}$ = gate to source voltage applied.

Devices $N_1$ and $N_2$ constitute a "current mirror" and are identical devices so that a current flowing into the drain of $N_1$ will produce a gate-source voltage on $N_2$ that will produce an equal drain current in $N_2$. Thus the current through $P_1$ is the same as that through $P_2$ and (if we disregard the LRC network for the moment) through $R_1$. Letting $K_P'(W_{P2}/L_{P2}) = K_{P2}$ and noting the equal current through $P_1$ and $P_2$, the current I can be expressed:

$$I = K_{P2}(V_{GSP2} - V_{TP})^2 = XK_{P2}(V_{GSP2} - V_{TP} - IR_1)^2.$$

solving the equation for I gives $$I = (\sqrt{X} - 1)^2/XR_1^2 K_{P2}.$$

Since transconductance is defined as $g_m = dI/dV_{GS}$, the $g_m$ of $P_1$ and $P_2$ are $$g_{mp1} = 2(\sqrt{X} - 1)/R_1$$

and $$g_{mp2} = 2(\sqrt{X} - 1)/R_1\sqrt{X}.$$

Solving for the small signal output $r_0$ looking into the node that is common to $R_1$ and the source of $P_1$ it is found that $r_0 = -R_1$. Thus the oscillator is a negative resistance oscillator. If $R_1$ is slightly greater than $R_S$, oscillation will start from device noise and build up until the incremental output resistance has an absolute value that is equal to $R_S$. Leakage currents cause the devices to turn on and conduct.

Although the frequency determining network, as illustrated in FIG. 1, comprises an inductor L, a series resistance $R_S$ and a capacitor C, the circuit may include a piezolelectric device, such as a quartz crystal or tuning fork, or a capacitor in series with a crystal. The important thing is that the frequency determining network operates in the low impedance, series resonant mode. Additionally, the use of a simple capacitor across the resistor $R_1$ will produce a relaxation oscillator.

Figure 2:
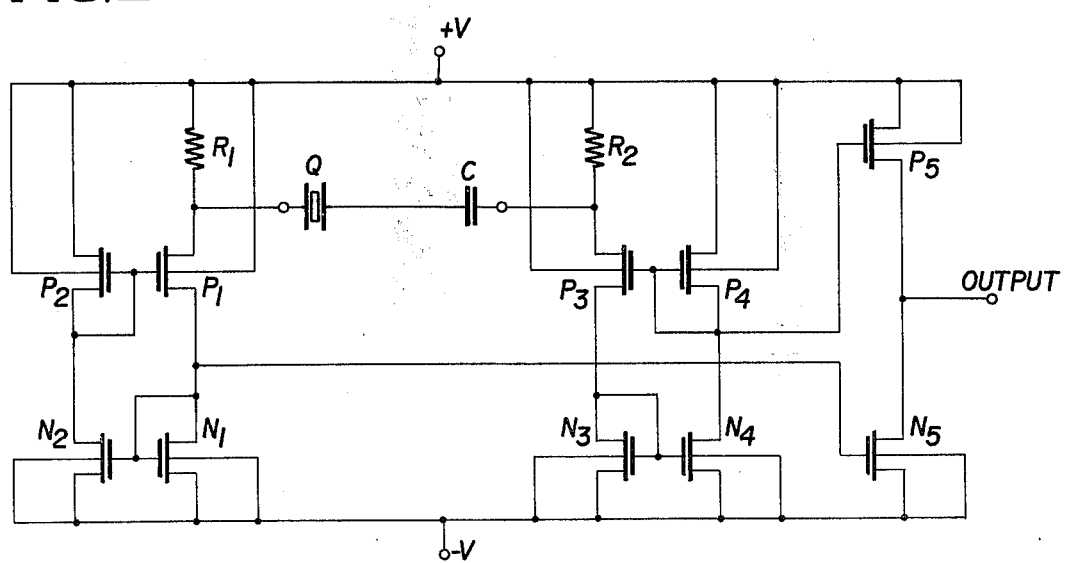
FIG. 2 is a schematic of a CMOS negative resistance oscillator according to the principles of the present invention providing a rectangular output.

A double sided configuration with a shaper output circuit to couple the signal out of the two sides and produce a rectangular wave output is illustrated in FIG. 2. In addition to the basic oscillator circuit including resistor $R_1$ and CMOS paris $P_1$ and $N_1$ and $P_2$ and $N_2$, the circuit of FIG. 2 includes a third pair of CMOS devices $P_3$ and $N_3$ and a fourth pair $P_4$ and $N_4$. A second resistance $R_2$ is connected between the voltage source +V and the source of P channel device $P_3$ which has a larger W/L ratio than the $P_4$. The connection of the third and fourth pair of CMOS devices is identical to the first and second pair respectively. The frequency determining circuit is illustrated as a crystal Q in series with capacitor C connected between the junction of resistor $R_1$ and large W/L device $P_1$ and the junction between $R_2$ and the larger W/L device $P_3$.

The output circuit includes a fifth pair of CMOS devices $P_5$ and $N_5$ connected between the voltage supply. The gate of $P_5$ is connected to the drain of $P_4$ or the common gate connection of $P_3$ and $P_4$ and the gate of $N_5$ is connected to the drain of $N_1$ or the common gate connection of $N_1$ and $N_2$. It should be noted that the gate of $P_5$ may be connected to the drain of $P_2$ and correspondingly the gate of $N_5$ connected to the drain of $N_3$. The importance being that the output P and N channel devices receive a signal from the common gate connection of their respective channel devices one from each side of the frequency determining network. The output is taken from the junction of MOS devices $P_5$ and $N_5$.

The oscillator circuit of FIG. 2, by providing a rectangular wave output, is designed to be used in digital circuits, for example digital watch circuits. The oscillator can be operated by a power supply voltage as low as one volt when built with devices having threshold voltages less than 0.7 volts.

Because of the relatively high output resistance of MOS devices operating in the saturated region, the oscillators of the present invention are relatively insensitive to power supply variations. If a high enough power supply voltage is available, the present oscillator could be made very insensitive to voltage supply variations using the circuit illustrated in FIG. 3. A sixth pair of CMOS devices $P_6$ and $N_6$ are connected in series between the first pair of CMOS devices $P_1$ and $N_1$. Similarly, a seventh pair of CMOS device $P_7$ and $N_7$ are connected in series between the second pair of CMOS devices $P_2$ and $N_2$. The gates of the P channel device $P_6$ and $P_7$ are connected to the drain of $P_7$ device, as are the gates of $P_1$ and $P_2$ connected to the drain of $P_2$. The N channel devices $N_6$ and $N_7$ have their gates connected to the drain of $N_6$ as are the gates of $N_1$ and $N_2$ connected to the drain of $N_1$.

The output circuit includes a resistor $R_3$ connected in series with a P channel device $P_8$ between the voltage supply. The gate of the $P_8$ is connected to the drain of $P_7$. It should be noted that if the circuit of FIG. 7 is configured such that the N channel device $N_1$ has larger W/L than $N_2$, the output circuit, would include an N channel device having its gate connected to the drain of $N_7$, the resistor $R_3$ would be between an $N_8$ and the $+V$, and the gates of $N_1$ and $N_2$ and $N_6$ and $N_7$ would be connected to the second and seventh pair instead of the first and sixth illustrated. The frequency determining network is illustrated simply as a crystal Q connected across the resistor $R_1$. The output is taken at the junction of resistor $R_3$ and the source of $P_8$.

Figure 3:
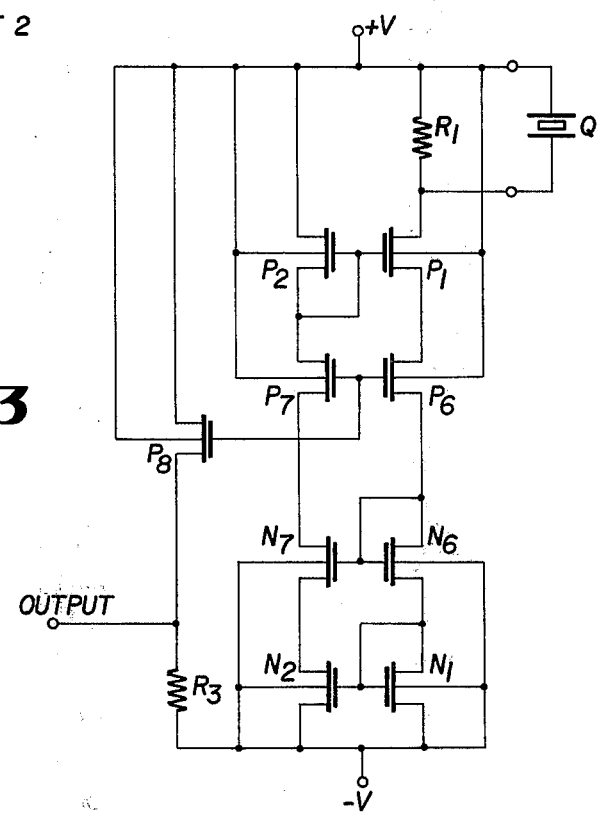
FIG. 3 is a schematic of a CMOS negative resistance oscillator according to the principles of the present invention providing a sinusoidal output superimposed on a DC level.

In the circuit of FIG. 3, MOS device $P_6$ and $N_7$ see the variation in the supply voltage and act to shield MOS devices $P_1$ and $N_2$ from the variations. The output signal is a sinusoidal waveform superimposed on a DC level. The sinusoidal portion of the output is low in harmonic content and thus may be used in radio receiver and transmitter applications.

From the preceding description of the preferred embodiments, it is evident that the objects of the invention are obtained in that a CMOS negative resistance oscillator is provided which reduces the number of linear components, is substantially insensitive to voltage supply variations, and provides a steady state operating current which is defined by the resistance in series with a larger W/L MOS device independent of other circuit elements. Although the invention has been described and illustrated in detail, it is to be clearly understood that the same is by way of illustration and example only and is not to be taken by way of limitation. The frequency determining network may be any circuit operated in the series low impedance mode. Similarly, the larger W/L Device may be the N channel device with the resistance connected to the source of such a device. FIGS. 2 and 3 illustrated at least two variations of the use of the circuit of FIG. 1 and other variations are considered to be encompassed by the present disclosure. The spirit and scope of this invention is to be limited only by the terms of the appended claims.

What is claimed:

1. A CMOS oscillator comprising:
   a first pair of CMOS devices having their source-drain paths connected in series to a voltage supply;
   a second pair of CMOS devices having their source-drain paths connected in series to said voltage source;
   gates of N channel devices being connected to the junction of said first pair;
   gates of P channel devices being connected to the junction of said second pair;
   a first resistance connected in series with the source of one of said MOS devices;
   a frequency determining network connected across said first resistance, said first resistance being greater than the resistance of said frequency determining network; and
   the width to length ratio of said one MOS device being greater than the width to length ratio of corresponding channel device of the other pair whereby said first resistance and the variance of the width to length ratio determine the steady state operating current.

2. The CMOS oscillator according to claim 1 wherein said frequency determining network is a series resonance network.

3. The CMOS oscillator according to claim 1 wherein said gate of said one MOS device and of its corresponding channel device are connected to the junction of the pair of said corresponding channel device.

4. The CMOS oscillator according to claim 1 including:
   a third pair of CMOS devices having their source-drain path connected in series with said voltage source;
   a fourth pair of CMOS devices having their source-drain path connected in series with said voltage source;
   the gates of the devices for the third and fourth pair are connected as are the gates of said first and second pair, respectively;
   a second resistance connected in series with the source of one of the MOS devices of said third or fourth pair having a greater width to length ratio than the corresponding channel device of the other third or fourth pair;
   said frequency determining network is connected in series between the junction of said first resistance and a respective source electrode and the junction of said second resistance and a respective source electrode.

5. The CMOS oscillator according to claim 4 including a fifth pair of CMOS devices having their source-drain paths connected in series with said voltage source as an output network; the gate of the N channel device of said fifth pair is connected to the N channel gate junction of either said first and second pair or third and fourth pair and the gate of the P channel device of said fifth pair is connected to the P channel gate junction of the remaining set of pairs.

6. The CMOS oscillator according to claim 1 including:
   a third pair of P channel devices having their source-drain paths connected in series with the P channel devices of said first and second pair respectively and having gates connected to the junction with said second pair; and
   a fourth pair of N channel devices having their source-drain paths connected in series between N channel devices of said first and second pair respectively and having gates connected to the junction with said first pair.

7. The CMOS oscillator according to claim 6 including a second resistance connected in series with said voltage source and a fifth MOS device having channel type of said one MOS device as an output network said gates of said fifth device, said one device and corresponding device are connected to the junction of the pair of said corresponding device.

8. A CMOS negative resistance oscillator comprising:
   a first resistance;
   means connected across said first resistance for determining the frequency of said oscillator;
   a first pair of CMOS devices having their source-drain paths connected in series with said first resistance and a voltage source;
   a second pair of CMOS devices having their source-drain paths connected in series with said voltage source;
   one MOS device of said first pair connected directly to said first resistance has a larger width to length ratio than the corresponding MOS device of said second pair to determine with said first resistance the nominal operating current of the oscillator independently of other circuit elements; and the remaining MOS device of said first and second pair are connected as current mirrors.

9. A CMOS negative resistance oscillator according to claim 8 wherein said means operates in series resonance and said first resistance is greater than the highest series resonant resistance of said means.

10. A CMOS negative resistance oscillator according to claim 8 wherein the gates of said one MOS device and said corresponding MOS device are connected to the device junction of said second pair.

11. A CMOS negative resistance oscillator according to claim 8 including:
a second resistance;
a third pair connected with said second resistance similar to said first pair and including another MOS device having a larger width to length ratio than another corresponding MOS device in a fourth pair;
a fourth pair connected similarly to said second pair;
said means being connected in series between the junction of said first and second resistances and their respective MOS devices.

12. A CMOS negative resistance oscillator according to claim 11 wherein the gates of said one MOS device and said corresponding MOS device are connected to the device junction of said second pair; and the gates of said another MOS device and said another corresponding MOS device are connected to the device junction of said fourth pair.

13. A CMOS negative resistance oscillator according to claim 12 including an output circuit having a fifth pair of CMOS devices having their source-drain path connected in series with said voltage source, the gate of the P channel output device being connected to the P channel gate connection of said first and second pair or said third and fourth pair and the N channel output device being connected to the N channel gate connection of the other set of pairs.

14. A CMOS negative resistance oscillator according to claim 8 including:
a third pair of CMOS devices having their source-drain path connected in series between the CMOS devices of said first pair;
a fourth pair of CMOS devices having their source-drain path connected in series between the CMOS devices of said second pair;
a second resistance connected in series with said voltage source and a fifth MOS device of the same channel type as said one MOS device;
gates of said one MOS device and corresponding MOS device are connected to the drain of said corresponding device;
gates of MOS devices of the same channel type as said one device in said third and fourth pair are connected to the drain of said same channel device of said fourth pair; and
gate of said fifth MOS device being connected to the drain of said same channel device of said fourth pair.

* * * * *